United States Patent
Mori et al.

[11] Patent Number: 6,051,975
[45] Date of Patent: Apr. 18, 2000

[54] GRADIENT MAGNETIC FIELD ELECTRONIC POWER SUPPLY FOR GRADIENT COIL

[75] Inventors: Kiyomi Mori, Yokohama; Shigehide Kuhara, Zama, both of Japan

[73] Assignee: Kabushiki Kaisha Toshiba, Kawasaki, Japan

[21] Appl. No.: 08/969,709

[22] Filed: Nov. 21, 1997

Related U.S. Application Data

[63] Continuation of application No. 08/612,579, Mar. 8, 1996, abandoned.

[30] Foreign Application Priority Data

Mar. 15, 1995 [JP] Japan .................................... 7-056220

[51] Int. Cl.⁷ .................................................. G01V 3/00
[52] U.S. Cl. ........................................ 324/322; 324/318
[58] Field of Search .................................. 324/322, 318, 324/300, 307, 309, 314

[56] References Cited

U.S. PATENT DOCUMENTS

| | | | |
|---|---|---|---|
| 5,245,287 | 9/1993 | Nowak et al. | 324/322 |
| 5,270,657 | 12/1993 | Wirth et al. | 324/322 |
| 5,311,136 | 5/1994 | Takahashi | 324/322 |
| 5,521,507 | 5/1996 | Rohan et al. | 324/322 |
| 5,617,030 | 4/1997 | Fischer et al. | 324/322 |

FOREIGN PATENT DOCUMENTS

| | | |
|---|---|---|
| 0 429 715 A1 | 6/1991 | European Pat. Off. . |
| 33 16 722 A1 | 11/1983 | Germany . |
| 38 08 995 A1 | 9/1988 | Germany . |
| 41 27 529 A1 | 2/1993 | Germany . |

OTHER PUBLICATIONS

"A 4–Switch GTO Speed–Up Inverter for Fast–Scan MRI", SMRM '92 Book of Abstracts. O.M. Mueller, et al.; p. 589, Aug. 8, 1992.

"A Resonant Multi Purpose Gradient Power Switch for High Performance Imaging", SMRM '92 Works–in–Progress. K.H. Ideler, et al; p. 4044, Aug. 8, 1992.

*Primary Examiner*—Louis Arana
*Attorney, Agent, or Firm*—Oblon, Spivak, McClelland, Maier & Neustadt, P.C.

[57] ABSTRACT

A gradient magnetic field power supply includes an amplifier for supplying current to a gradient coil. Between input and output of the amplifier is connected a feedback circuit which feeds a portion of an output current at the output back to the input and has a built-in phase compensating circuit for compensating the phase of the feedback current. The frequency response of the phase compensating circuit is made variable and adjusted to fit variations in the load impedance of the amplifier with time. This ensures optimum phase compensation.

5 Claims, 12 Drawing Sheets

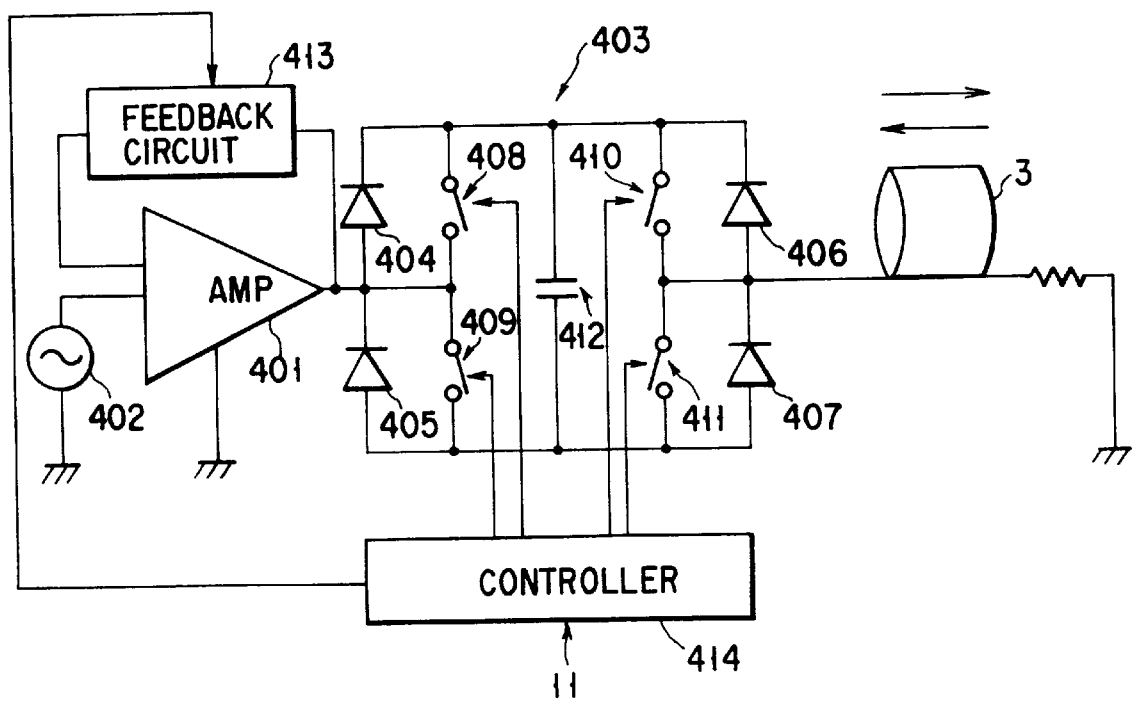
F I G. 3

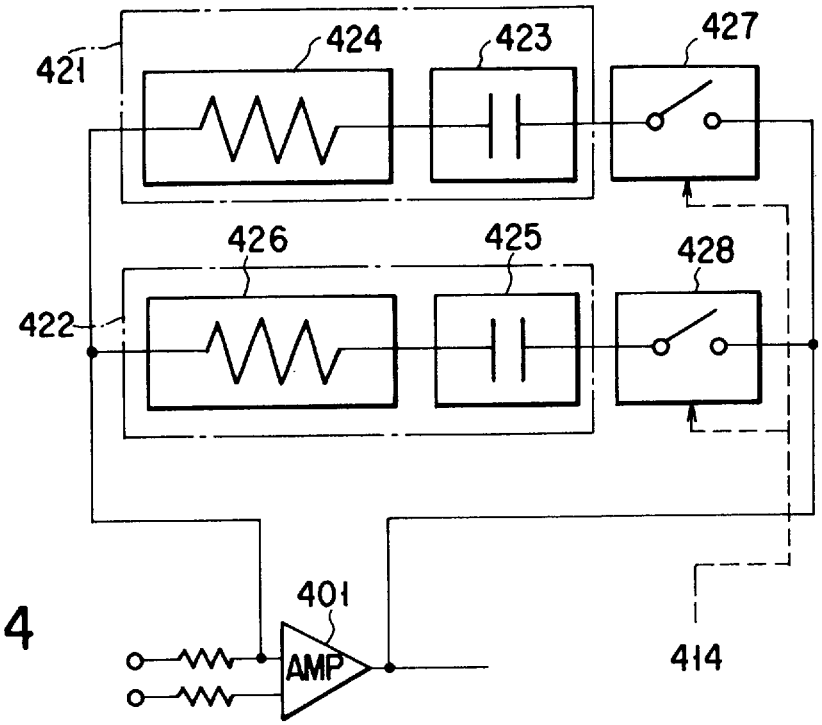
FIG. 4
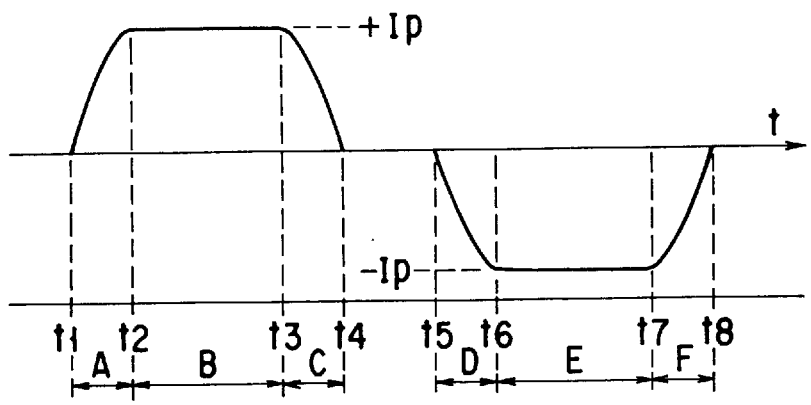
FIG. 5
FIG. 6
| | 408 | 404 | 409 | 405 | 410 | 406 | 411 | 407 |
|---|---|---|---|---|---|---|---|---|
| A | | | ON | | ON | | | |
| B | | ON | | | ON | | | |
| C | | ON | | | | | | ON |
| D | ON | | | | | | ON | |
| E | ON | | | | | ON | | |
| F | | | | ON | | ON | | |

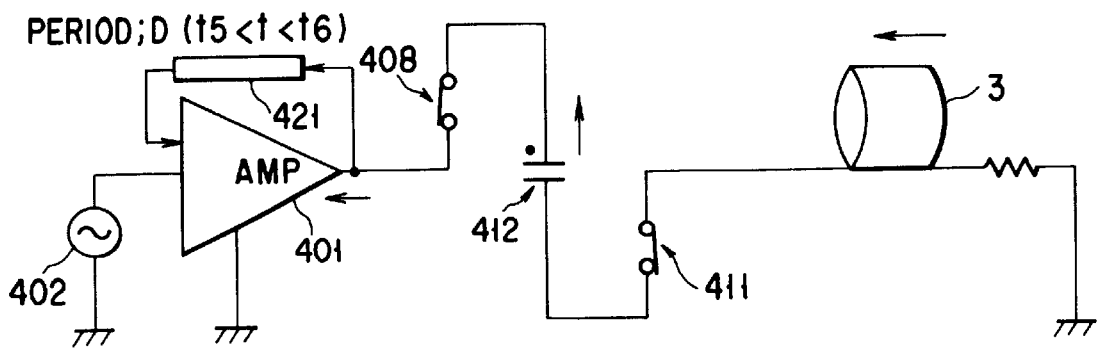
F I G. 8A
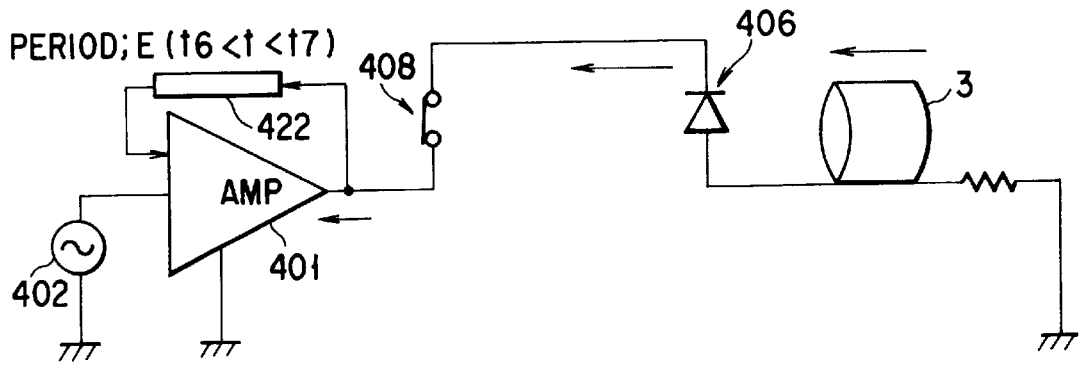
F I G. 8B
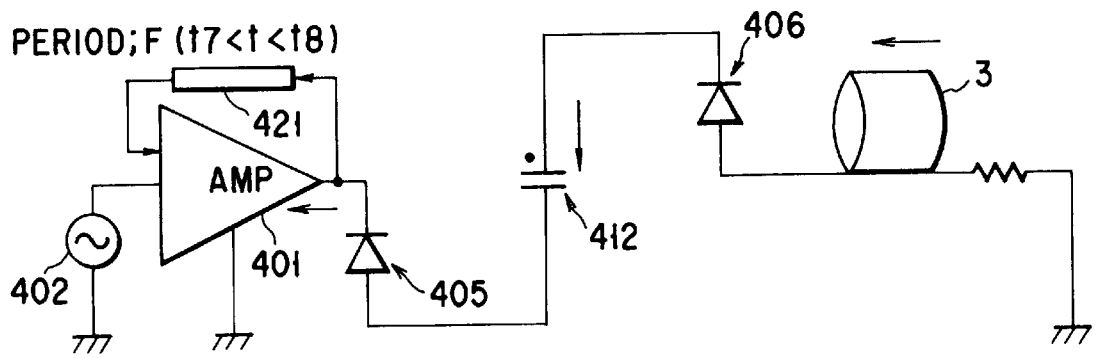
F I G. 8C

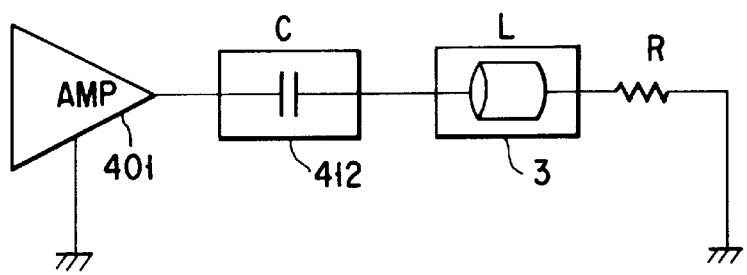
FIG. 9
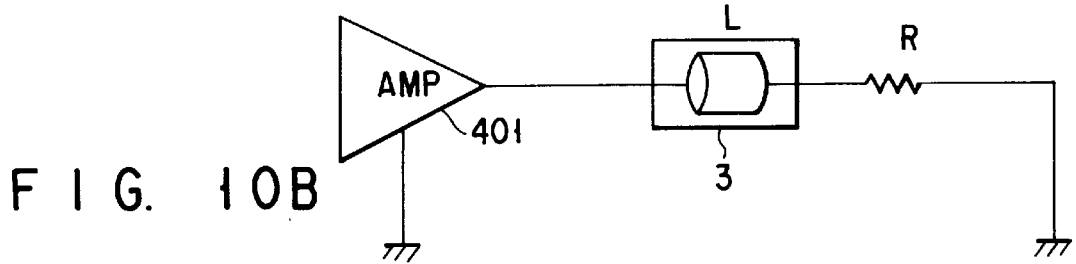
FIG. 10A
FIG. 10B
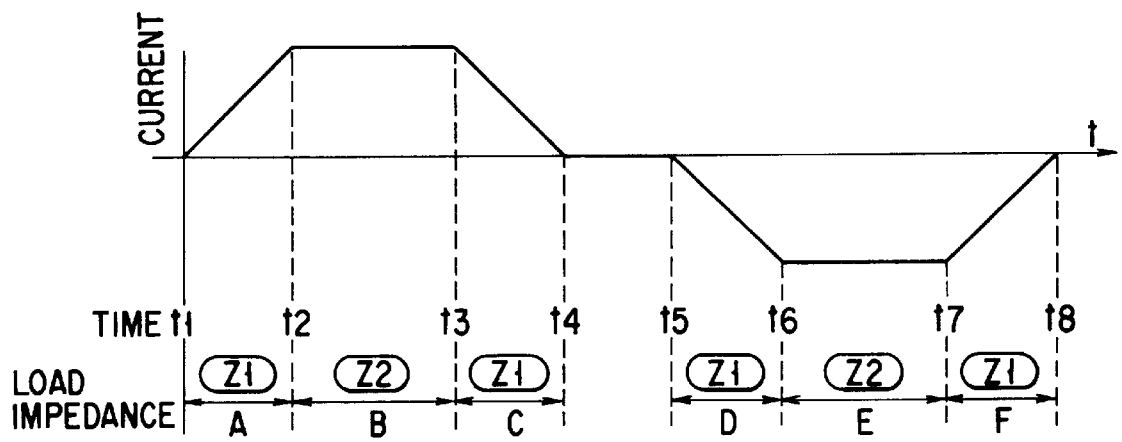
FIG. 11

| PERIOD | LOAD IMPEDANCE | SELECTED PHASE COMPENSATING CIRCUIT | 427 | 428 |
|---|---|---|---|---|
| A | Z1 | 421 | ON | OFF |
| B | Z2 | 422 | OFF | ON |
| C | Z1 | 421 | ON | OFF |
| D | Z1 | 421 | ON | OFF |
| E | Z2 | 422 | OFF | ON |
| F | Z1 | 421 | ON | OFF |
FIG. 12
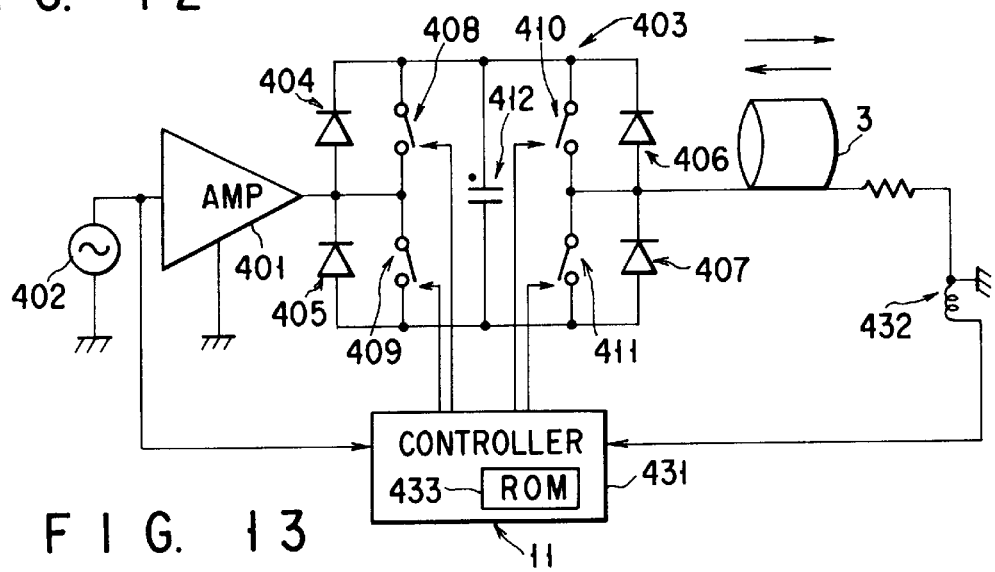
FIG. 13
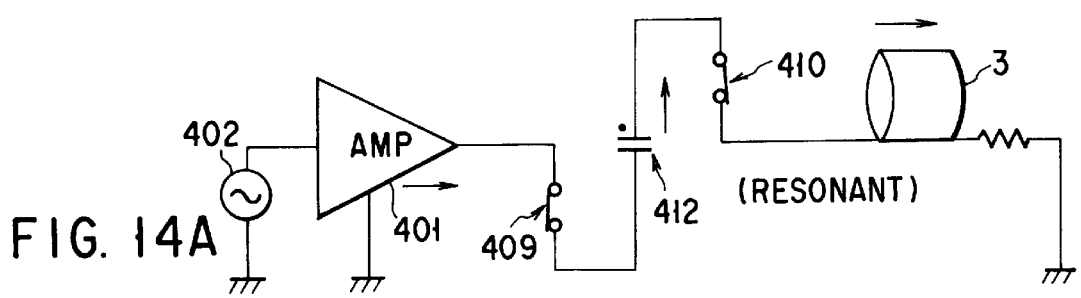
FIG. 14A
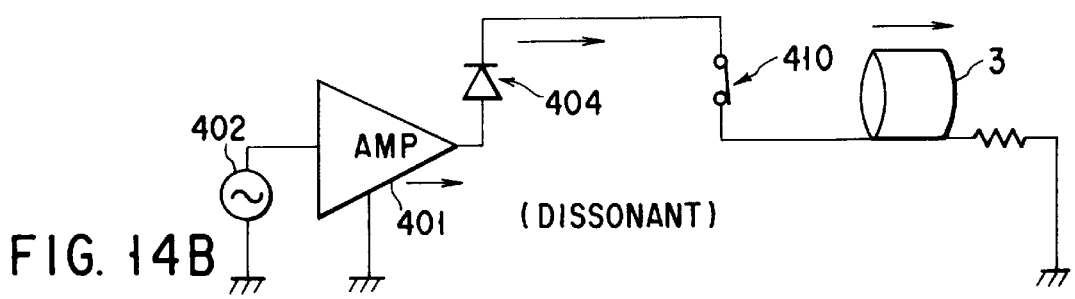
FIG. 14B

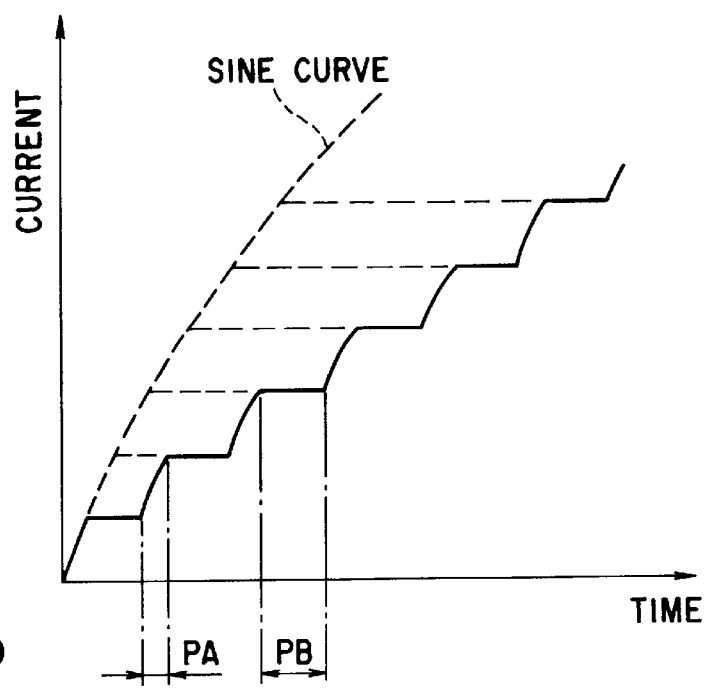
F I G. 15
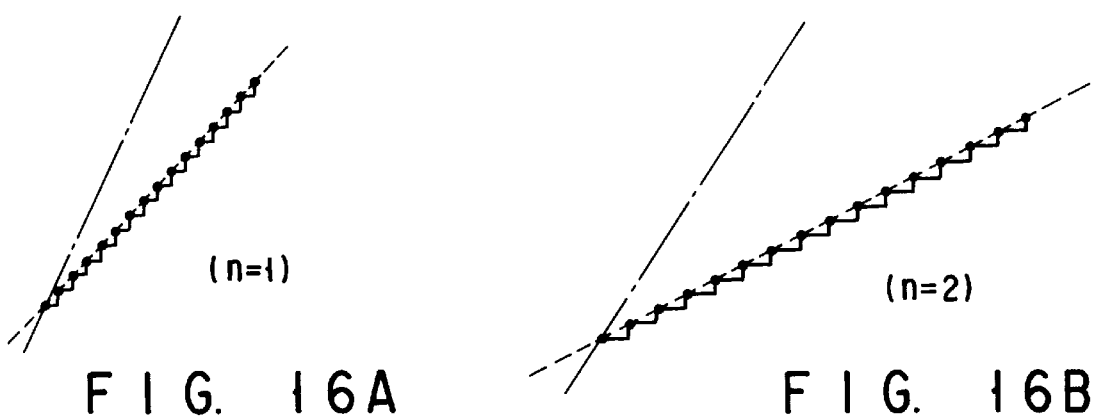
F I G. 16A (n=1)
F I G. 16B (n=2)
F I G. 16C (n=3)

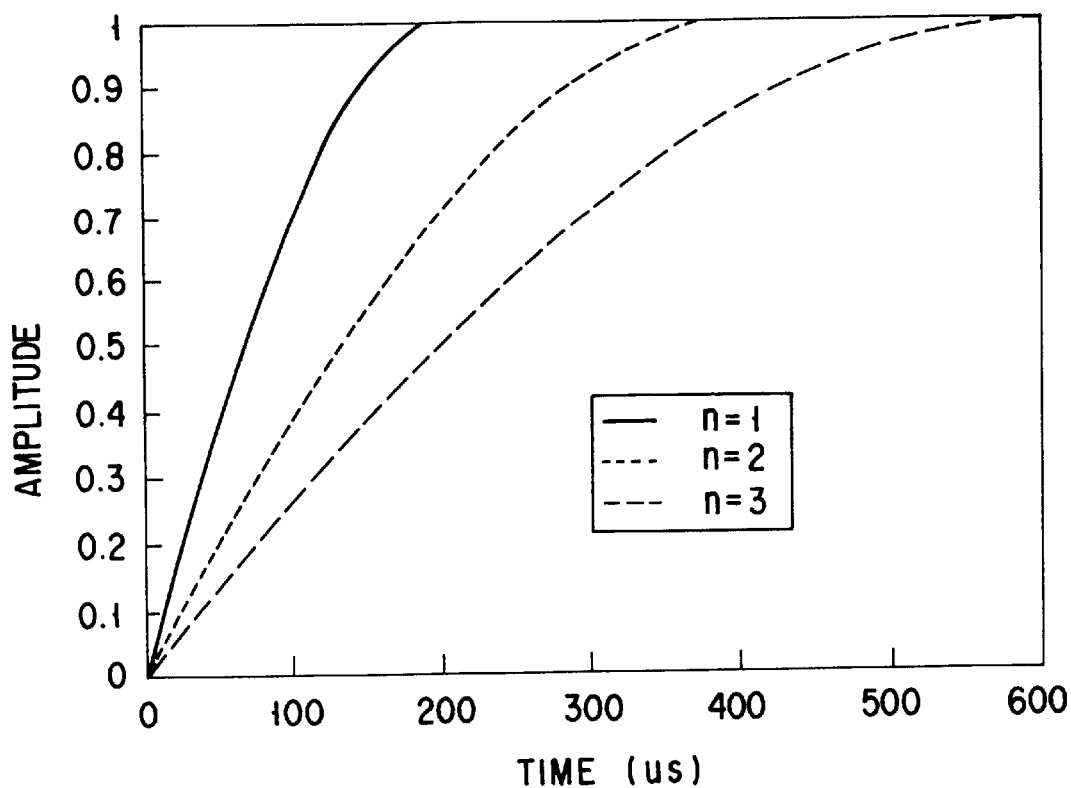
F I G. 17
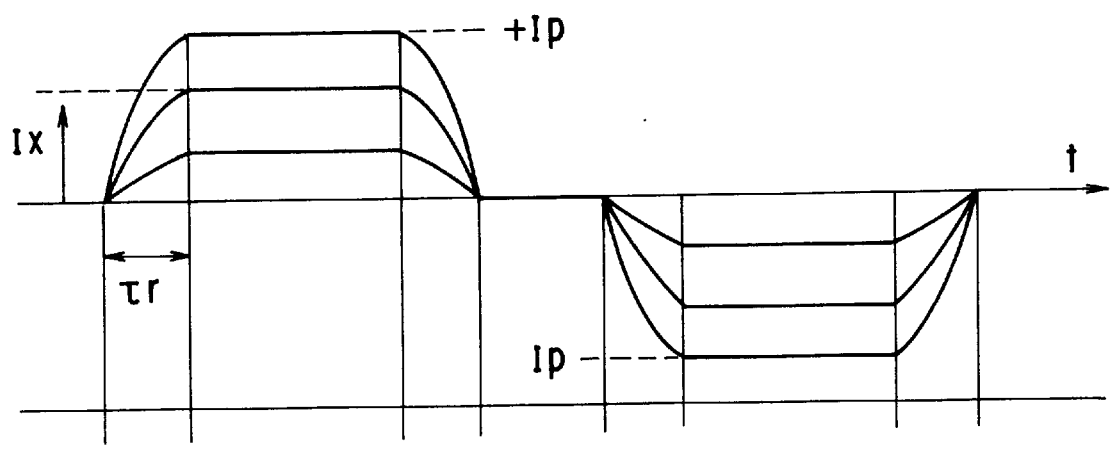
F I G. 18

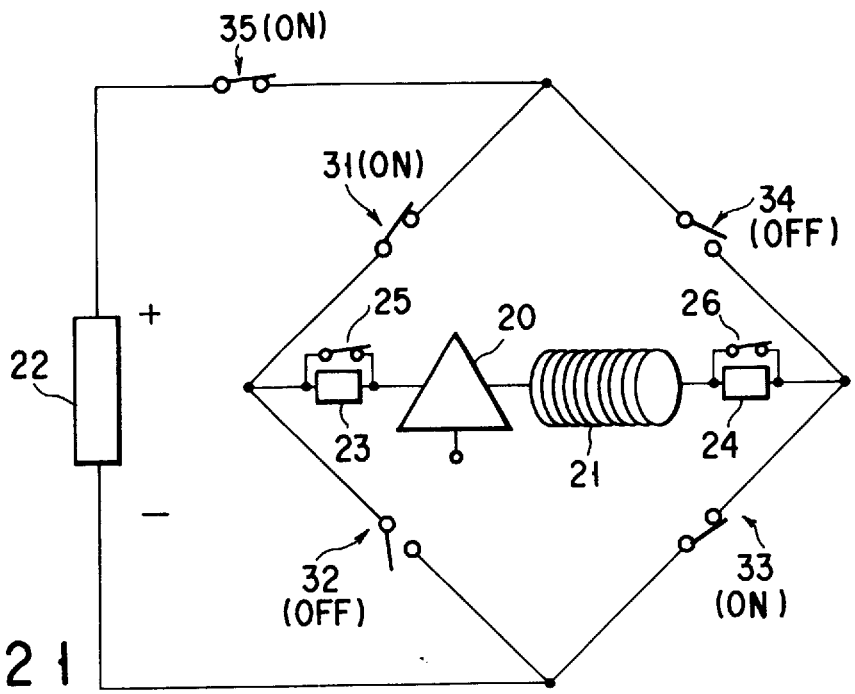
F I G. 21
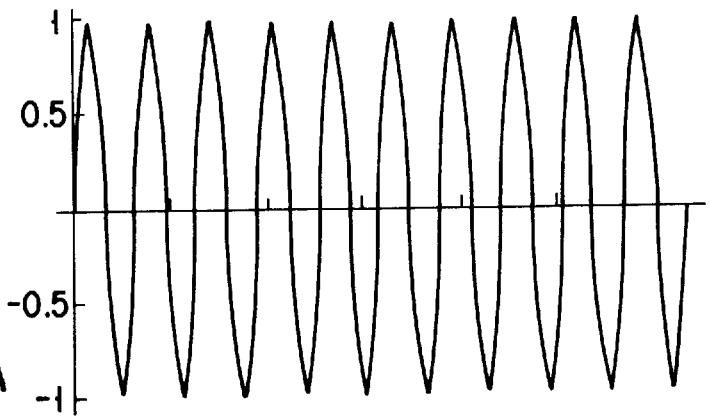
F I G. 22A
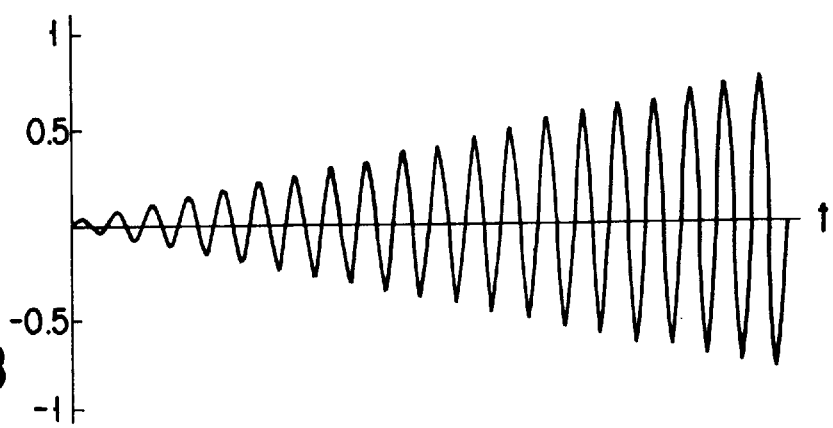
F I G. 22B

GRADIENT MAGNETIC FIELD ELECTRONIC POWER SUPPLY FOR GRADIENT COIL

This application is a Continuation of application Ser. No. 08/612,579, filed on Mar. 8, 1996, now abandoned.

BACKGROUND OF THE INVENTION

1. Field of the Invention

The present invention relates to a gradient magnetic field power supply which supplies a current to a gradient coil for producing a gradient magnetic field.

2. Description of the Related Art

With very high speed imaging methods, such as echo planar imaging (EPI), the acquisition of data needed to reconstruct one magnetic resonance image is finished in some tens of milliseconds. In order to implement vary high speed imaging, it is required to cause a gradient magnetic field to rise rapidly. A general gradient coil has an inductance of some millihenries and a resistance on the order of one ohm to hundreds of milliohms. In the ordinary imaging method, a current of 100 to 200 amperes is used to generate a gradient magnetic field of about 1 G/cm. To provide a current of 150 amperes and a coil inductance of one millihenry within one millisecond, a supply voltage of 150 volts are required, assuming that there is no resistance component involved. In the very high-speed imaging method, it is necessary to generate a current about three times greater, that is a high intensity gradient magnetic field, within about five to ten times shorter time. For example, to generate a current of 450 amperes within 200 microseconds, a voltage of 2250 volts must be applied. Gradient magnetic field power supplies generally used with magnetic resonance imaging apparatus have a capability of providing an output voltage of at most 200 volts, which does not meet the above condition. Thus, various measures have been taken so far to accomplish the fast rise of a gradient field required with the very high speed imaging through the use of general gradient magnetic field power supplies.

A first measure is to employ resonance for the purpose of raising a current supplied to a gradient coil. Between a power supply and a gradient coil is connected a capacitor, which constitutes a resonant circuit with the coil. Owing to resonance, a current rises rapidly. When the current reaches a predetermined level, the capacitor is removed, so that the coil is directly connected to the power supply. The power supply then supplies a current of constant magnitude to the coil.

Note that the power supply comprises a negative feedback amplifier the feedback circuit of which consists of a resistor and a phase compensation capacitor.

When a resonance phenomenon is used to raise a current as described above, the load impedance of the power supply varies with time. During the interval when the current is rising, the load impedance is determined by the capacitance C of the capacitor and the inductance L and the resistance R of the gradient coil. When the current is constant, the load impedance is determined by the inductance L and the resistance R of the gradient coil.

With variations in the load impedance with time, the feedback circuit will not achieve proper phase compensation. Therefore, the use of resonance serves to raise the current fast on the one hand, and lowers the stability of the power supply on the other hand.

In addition, when the resonance is employed so as to cause the current to rise fast, the current rise time will depend on the time constant of the resonant circuit. It is, therefore, impossible to regulate the rise time.

A second measure is to support the main gradient field power supply with an auxiliary high-voltage power supply when the current to the gradient coil rises.

FIG. 1 shows an arrangement of such a gradient magnetic power supply as uses an auxiliary power supply. Switches SW1 to SW4 are connected in a bridge configuration. A series combination of a main power supply and a gradient coil is connected between two points, each on a respective one of the two branches of the bridge. An auxiliary power supply is connected in series with a switch SW5 between the two other points of the bridge. A pair of switches SW1 and SW3 on the opposed arms of the bridge is simultaneously turned ON or OFF. Likewise, the other pair of switches SW2 and SW4 is simultaneously switched ON or OFF. Selectively turning ON one of the pairs of switches allows the polarity of current supplied from the auxiliary power supply to the gradient coil to be changed arbitrarily. The switch SW5 is turned ON during the interval when the current is rising or falling. The auxiliary power supply supports the main power supply so as to allow the supply current to the gradient coil to rise fast.

With the echo planar imaging, an alternated gradient magnetic field whose polarity alternates fast is needed. The waveform of a gradient magnetic field is shaped into a sinusoidal waveform etc. To change the current polarity in succession, the fast switching of the switches SW1 to SW4 is required.

However, the fast switching causes switching noise, which deteriorates the signal-to-noise ratio in magnetic resonance image data.

SUMMARY OF THE INVENTION

It is an object of the invention to provide a gradient magnetic field power supply which permits optimum phase compensation to be achieved while following a time-varying load impedance.

It is another object of the invention to provide a resonance type of gradient magnetic field power supply which permits the rise time of current supplied to a gradient coil to be regulated.

It is still another object of the invention to provide an auxiliary-power-supply-based type of gradient magnetic field power supply which permits switching noise to be reduced.

According to an aspect of the invention there is provided a gradient magnetic field power supply for gradient coil comprising: amplifier means for supplying a current to the gradient coil; feedback circuit means for feeding a portion of an output current of the amplifier means back to an input of the amplifier; phase compensating means for compensating the phase of a feedback current from the feedback circuit means to the amplifier means, the phase compensating means having its frequency response made variable; and changing means for changing the frequency response of the phase compensating means according to a change in a load impedance of the amplifier means.

According to another aspect of the invention there is provided a gradient magnetic field power supply for gradient coil comprising: amplifier means for supplying a current to the gradient coil; a capacitor; and current raising means for causing the current to rise by switching between first and second states, the first state being such that the capacitor is inserted between the gradient coil and the amplifier means and the gradient coil and the capacitor forms a series resonant circuit and the second state being such that the capacitor is removed from between the gradient coil and the amplifier means and the gradient coil and the amplifier means are directly connected to each other.

According to still another aspect of the invention there is provided a gradient magnetic field power supply for gradient coil comprising: a main power supply for supplying a current to the gradient coil; an auxiliary power supply for supplying a current to the gradient coil; switching means for alternating the polarity of the auxiliary power supply with respect to the gradient coil to thereby alternate the direction of a gradient magnetic field produced by the gradient coil; and lowpass filters connected to both ends of the gradient coil.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 shows an arrangement of a gradient magnetic field power supply according to a first embodiment of the invention;

FIG. 4 shows an arrangement of the feedback circuit of FIG. 3;

FIG. 5 shows current waveforms;

FIG. 6 shows the states of the switches and the diodes of FIG. 2 in each of the intervals shown in FIG. 5;

FIGS. 8A, 8B and 8C each show the state of the power supply in a respective one of the intervals D, E and F shown in FIG. 5;

FIG. 9 shows the load impedance of the power supply in each of the intervals of FIG. 5;

FIG. 10A is a diagram for use in explanation of the load impedance Z1;

FIG. 10B is a diagram for use in explanation of the load impedance Z2;

FIG. 11 shows current waveforms output from the power supply and variations in load impedance of the power supply with time;

FIG. 12 shows switch states and selected capacitors in each of the intervals of FIG. 5;

FIG. 13 shows an arrangement of a gradient magnetic field power supply according to a second embodiment of the invention;

FIG. 14A shows the power supply in resonance;

FIG. 14B shows the power supply in non-resonance;

FIG. 15 is a diagram for use in explanation of the principle of regulation of the rise time of current;

FIGS. 16A, 16B and 16C show changes in current waveform resulting from changes of the ratio of the resonant state to the non-resonant state in duration;

FIG. 17 shows changes in current rise time each corresponding to a respective one of the current waveforms of FIGS. 16A, 16B and 16C;

FIG. 18 show current waveforms based on constant rise time control;

FIG. 21 shows the state of the gradient magnetic field power supply in the interval when the current is rising in FIG. 20;

FIGS. 22A and 22B show current waveforms approximating sinusoidal wave;

DETAILED DESCRIPTION OF THE PREFERRED EMBODIMENTS

Figure 1:
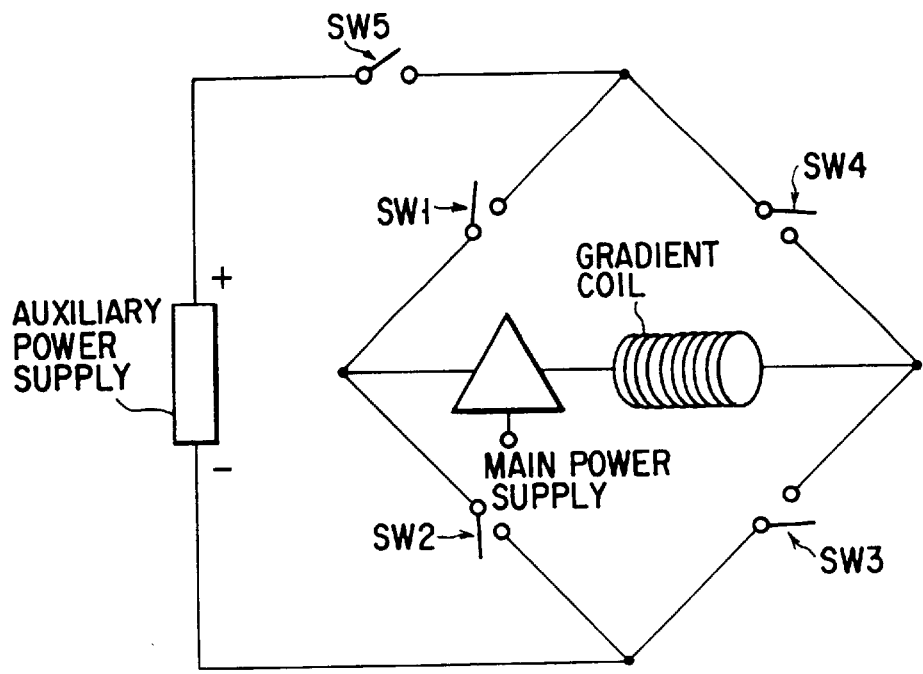
FIG. 1 shows an arrangement of a conventional gradient magnetic field power supply which uses an auxiliary power supply to support a main power supply.
Figure 2:
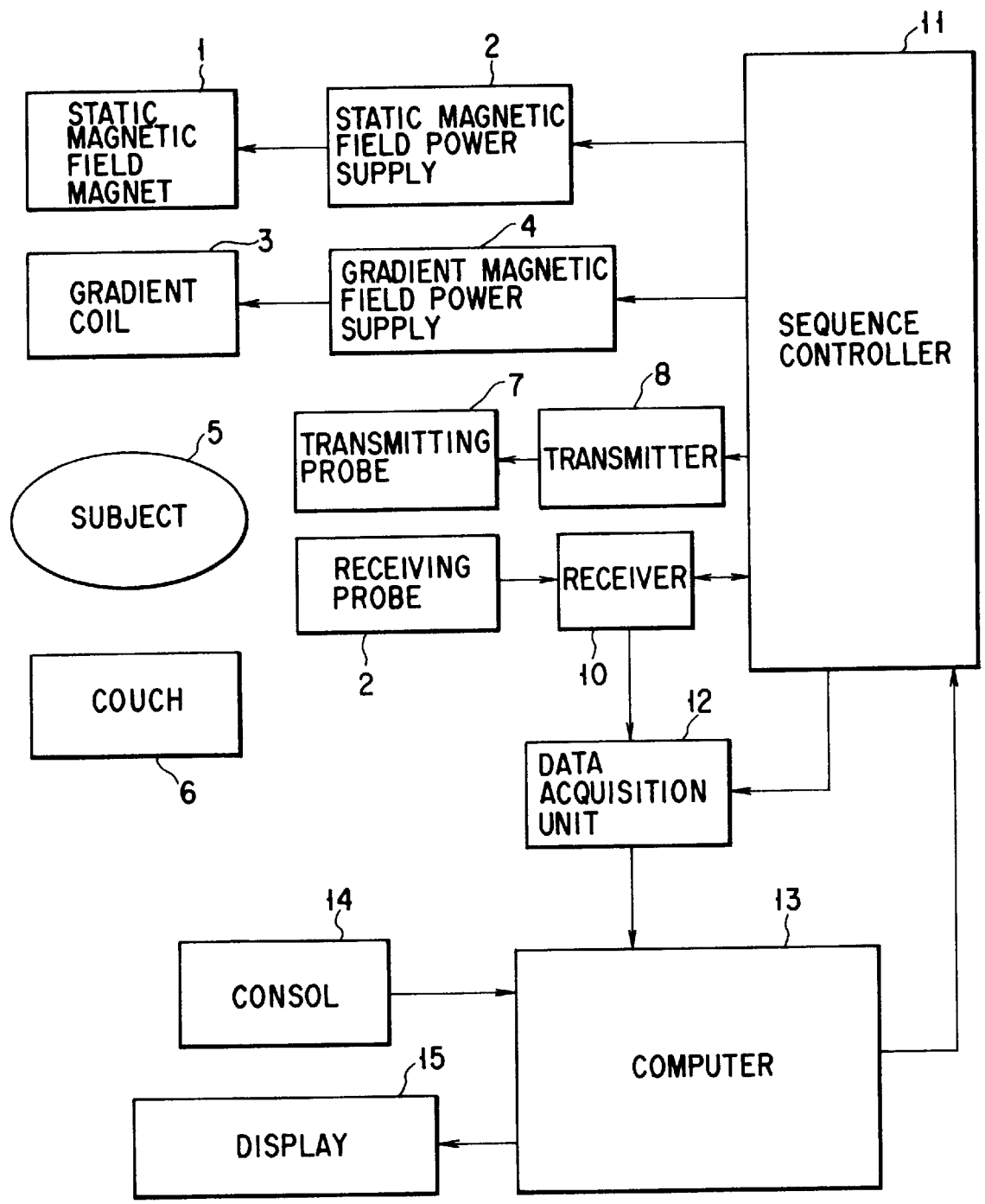
FIG. 2 is a general view of a magnetic resonance imaging apparatus.

FIG. 2 is a schematic representation of a magnetic resonance imaging apparatus, which includes a coil assembly as its principal component. The coil assembly has a cylindrical space within it to accommodate a portion of a human body under examination. The human body is laid down on a couch 6 and moved to within the space.

A static magnetic field magnet 1 is supplied with current from a static magnetic field power supply 2 to provide a static magnetic field within the space, when the superconducting magnet is excited. Note here that the direction of the static magnetic field is defined as the Z-direction of the conventional XYZ coordinate system, a direction perpendicular to the Z-direction is defined as the X-direction, and a direction perpendicular to the XZ plane is defined as the Y-direction.

A gradient coil assembly 3 is supplied with a current from gradient magnetic field power supplies 4 to provide gradient fields Gx, Gy, and Gz. The gradient field Gx is one whose strength varies linearly along the X-direction, Gy is one whose strength varies linearly along the Y-direction, and Gz is one whose strength varies linearly along the Z-direction.

A transmitting probe 7, also called an RF coil, is supplied with radio-frequency current from a transmitter 8 to provide a radio-frequency magnetic field (an RF pulse), which excites magnetic spins of, for example, protons within the human body 5. The excited magnetic spins produce a magnetic resonance signal, which is received by a receiving probe 9 and then applied to a receiver 10. A single probe may be used as the transmitting probe 7 and the receiving probe 9.

The receiver 10 amplifies and detects the magnetic resonance signal, which, in turn, is converted by a data collector 12 into digital form.

A computer 13 reconstructs magnetic resonance image data from digital signals output from the data collector 12. A typical example of the reconstruction processing is two-dimensional Fourier transform. An image display 15 visually displays a magnetic resonance image reconstructed by the computer 13. A console 14 is connected to the computer 13.

A system controller 11 sequentially controls the gradient magnetic field power supply 4, the transmitter 8, the receiver 10, and the data collector 12 to carry out a pulse sequence, for example, a spin-echo pulse sequence.

FIG. 3 shows an arrangement of the gradient magnetic field power supply 4, which is constructed from an amplifier 401, a waveshaper 402, a switching circuit 403, a feedback circuit 413, and a controller 414. The amplifier 401 is connected to the coil 3 through the switching circuit 403.

The switching circuit 5 includes four diodes 404 to 407 and four high-speed semiconductor switches 408 to 411, such as IGBTs (Insulated Gate Bipolar Transistors). The four diodes 404 to 407 and the four semiconductor switches 408 to 411 are connected so that switching can be made between a first state (resonant state) and a second state (non-resonant state) according to combinations of ON/OFF states of the four semiconductor switches. Further, the diodes 404 to 407 and the semiconductor switches 408 to 411 are connected so that the combinations of ON/OFF states of the four semiconductor switches allow the direction of current to be switched.

The resonant state refers to a state in which a capacitor 412 is inserted between the amplifier 401 and the gradient coil 3, in which case the capacitor and the gradient coil forms a resonant circuit. The non-resonant state refers to a state in which the amplifier and the gradient coil are directly connected to each other with no capacitor inserted.

The controller 414 performs ON/OFF control on the semiconductor switches 408 to 411 so that the resonant state will be obtained during the interval when current rises and during the interval when the current falls. Also, the controller controls the semiconductor switches 408 to 411 to switch from the resonant state to the non-resonant state when the current rises up to a predetermined level and then obtain steady current. Thus, the gradient power supply 4 is a resonant type of power supply that increases the speed at which current rises and falls through the use of resonance.

With this type of power supply, the load impedance of the amplifier 10 varies between the resonant state and the non-resonant state. The load impedance (first load impedance) Z1 in the resonant state is determined by the capacitance C of the capacitor 412 and the inductance L and the resistance R of the gradient coil 3. The load impedance (second load impedance) Z2 in the non-resonant state is determined by the inductance L and the resistance R of the gradient coil 3 only.

The waveshaper 402 provides a waveform signal to the amplifier 401, which changes the amplitude of its output current according to the waveform signal.

The amplifier 401 is of a negative feedback type that ensures operation stability. A feedback circuit 413 feeds a portion of output current of the amplifier 401 back to its input in the form of negative feedback. The feedback circuit 413 has a built-in phase compensation circuit to ensure operation stability.

FIG. 4 shows an arrangement of the phase compensation circuit of the feedback circuit 413. The phase compensation circuit has a first one 421 and a second one 422. The first and second phase compensation circuits 421 and 422 are each connected in parallel with the amplifier 401. A high-speed semiconductor switch 427 is connected in series with the first phase compensation circuit 412, while a high-speed semiconductor switch 427 is connected in series with the second phase compensation circuit 422.

The semiconductor switches 427 and 428 are operated in the opposite phases under the control of the controller 414. That is, when the switch 427 is closed, the switch 428 is open and vice versa. When the switch 427 is closed and the switch 428 is open, the first phase compensation circuit 421 is switched into connection with the amplifier 401 and the second phase compensation circuit 422 is switched out of connection with the amplifier. When the switch 427 is open and the switch 428 is closed, on the other hand, the first compensation circuit 421 is disconnected from the amplifier and the second compensation circuit 422 is connected to the amplifier.

The first phase compensation circuit 421 has a first fixed capacitor 423 and a first fixed resistor 424. The second phase compensation circuit 422 has a second fixed capacitor 425 and a second fixed resistor 426. The frequency response (first frequency response) FC1 of the first phase compensation circuit 421 is determined by the capacitance C1 of the first fixed capacitor 423 and the resistance R of the first fixed resistor 424. The frequency response (second frequency response) FC2 of the second phase compensation circuit 422 depends on the capacitance C2 of the second fixed capacitor 425 and the resistance R2 of the second fixed resistor 426. The first and second frequency responses FC1 and FC2 differ from each other.

The frequency response FC1 of the first phase compensation circuit 421 is determined so as to make optimum phase compensation for the first load impedance Z1 in resonance. The frequency response FC2 of the second phase compensation circuit 422 is determined so as to make optimum phase compensation for the second load impedance Z2 in nonresonance.

The first load impedance Z1 is determined by the impedance of the series resonant circuit composed of the gradient coil 3 and the capacitor 412, while the second load impedance Z2 is determined by the impedance of the circuit when the capacitor 412 is removed from the series resonant circuit.

Hereinafter the operation of the switching circuit 403 will be described.

FIG. 5 shows a general waveform of an output current of the gradient power supply 4. In FIG. 5, intervals A and D are rising intervals, intervals B and E are steady-state intervals, and intervals C and F are falling intervals. FIG. 6 shows the ON/OFF states of the switches 408 to 411 and the conductive states of the diodes 404 to 407 in each of the intervals shown in FIG. 5. Each of the blanks in FIG. 6 stands for the "OFF" or "nonconductive" state of a corresponding component.

Figure 7A:
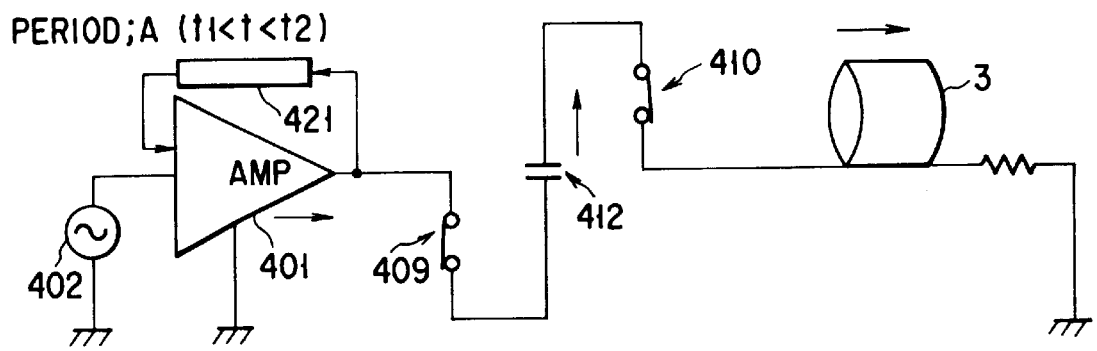
FIGS. 7A, 7B and 7C each show the state of the power supply in a respective one of the intervals A, B and C shown in FIG. 5.

During the interval A, the switches 409 and 410 are turned ON as shown in FIG. 7A. The capacitor 412 and the gradient coil 3 are thus connected in series, forming a series resonant circuit. In operation, electric charge stored on the capacitor 412 is applied to the gradient coil 3 in the form of a high voltage. A current flows in the forward direction and gradually increases in magnitude. When the current reaches a predetermined magnitude (+Ip), a transition is made from the interval A to the interval B.

Figure 7B:
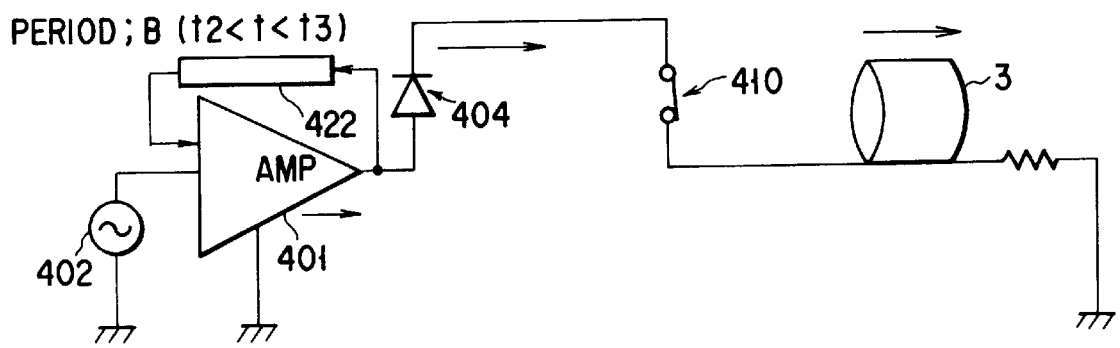
Figure 7C:
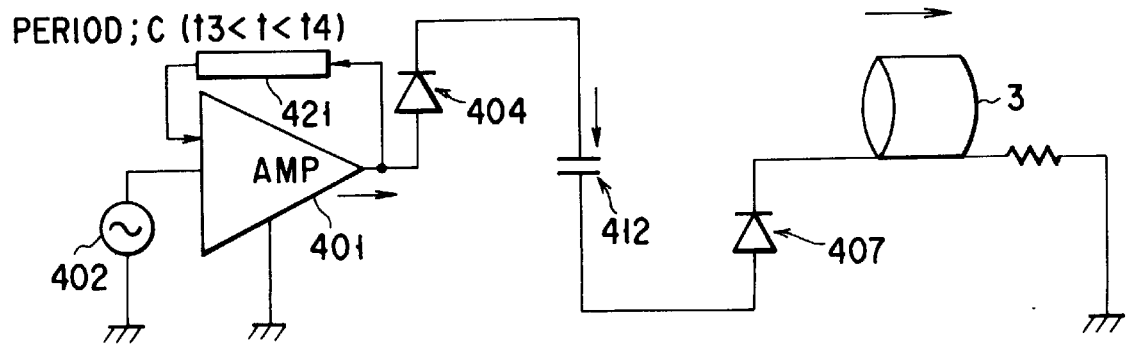

During the interval B, as shown in FIG. 7B, the switch 410 continues to be turned OFF and the switch 409 is moved from ON to OFF. The gradient coil 3 is thus connected to the amplifier 401 through the diode 404, resulting in the non-resonant state. During this interval B, electric charge stored on the capacitor 412 is stored in the gradient coil as inductive energy. A current flows in the forward direction and its magnitude is maintained at Ip. When the interval B reaches a given time, a transition is made from the interval B to the interval C.

During the falling interval C, the switch 410 is switched from ON to OFF. The capacitor 412 and the gradient coil 3 are therefore connected in series, resulting in the resonant state. During this interval C, the inductive energy stored in the gradient coil 3 is stored again on the capacitor 412 in the form of electric charge. A current flows in the forward direction and gradually decreases in magnitude.

During the next rising interval D, the switches 408 and 411 are turned ON as shown in FIG. 8A. Thereby, the capacitor 412 and the gradient coil 3 are connected in series, resulting in resonant state. During this interval D, the electric charge on the capacitor 412 is applied to the gradient coil 3. A current flows in the forward direction and gradually increases in magnitude. When the current reaches a given magnitude (−Ip), a transition is made from the interval D to the interval E.

During the interval E, the switch 408 continues to be ON and the switch 411 is switched from ON to OFF as shown in FIG. 8B. The gradient coil 3 becomes connected to the amplifier 401 through the diode 406, resulting in non-resonant state. During this interval E, the electric charge on the capacitor 412 is stored in the gradient coil as inductive energy. A current flows in the reverse direction with its magnitude maintained at Ip.

During the falling interval F, as shown in FIG. 8C, the switch 408 is changed over from ON to OFF. Thereby the capacitor 412 and the gradient coil 3 are connected in series to form a series resonant circuit. During this interval C, the inductive energy stored in the gradient coil is stored again on the capacitor 412 in the form of electric charge. A current flows in the reverse direction and its magnitude gradually decreases.

FIGS. 9 and 11 show the load impedances in the intervals shown in FIG. 5. During the intervals A, C, D and F when resonance occurs, the first load impedance Z1 is determined by the capacitance C of the capacitor 412 and the inductance L and the resistance R of the gradient coil 3 as shown in FIG. 10A. During the non-resonant intervals B and E, the second impedance Z2 is determined by the inductance L and the resistance R of the gradient coil 3 as shown in FIG. 10B.

Thus, the load impedance of a resonant type of power supply changes in a cycle of Z1–Z2–Z1.

Next, a selection between the first and second phase compensation circuits will be described. The frequency response FC1 of the first phase compensation circuit 421 is determined so as to make optimum phase compensation for the first load impedance Z1 in resonance. The frequency response FC2 of the second phase compensation circuit 422 is determined so as to make optimum phase compensation for the second load impedance Z2 in non-resonance.

The controller 414 selects between the first and second phase compensation circuits 421 and 422.

FIG. 12 shows the ON/OFF states of the switches 427 and 428 and the corresponding phase compensation circuit in each of the intervals shown in FIG. 5. During the intervals A, C, D and F when resonance is produced, the switch 427 is turned ON and the switch 428 is turned OFF, selecting the first phase compensation circuit 421. Then, the optimum phase compensation is realized for the load impedance Z1. During the intervals B and E when no resonance is produced, on the other hand, the switch 427 is turned OFF and the switch 428 is turned ON, selecting the second phase compensation circuit 422. The optimum phase compensation is realized for the load impedance Z2.

With a resonant type of power supply, the load impedance varies with time. By causing the frequency response of the phase compensation circuit to follow the variations in the load impedance, the optimum phase compensation can be constantly made.

In the present embodiment, frequency response changes are made by making a selection among multiple phase compensation circuits with different frequency responses, two in this example. The frequency response of each phase compensation circuit is fixed. Thus, the frequency response can be changed faster than with a single phase compensation circuit which has a variable capacitor and a variable resistor and has its frequency response changed by tuning each of them. In addition, an error in frequency response due to variable-component malfunctions will not occur.

Moreover, a switch is provided for each of the phase compensation circuits and a selection is made from among the phase compensation circuits by selectively turning the corresponding switch ON. This provides a fast, reliable selection between the phase compensation circuits.

FIG. 13 shows an arrangement of a gradient magnetic field power supply according to a second embodiment of the invention. In this figure, like reference numerals are used to denote corresponding parts to those in FIG. 3 and description thereof is omitted. As with the first embodiment, the second embodiment is directed to a resonant type of power supply that utilizes resonance for current rise. A problem with this type of power supply is that the rise time of current is uniquely determined by a resonance frequency and thus cannot be variable. The second embodiment is intended to provide a resonant type of power supply that permits the current rise time to be variable.

FIG. 14A shows the power supply in the resonant state in which the capacitor 412 is inserted between the amplifier 401 and the gradient coil 3, while FIG. 14B shows the power supply in the non-resonant state in which the gradient coil 3 is directly connected to the amplifier 401. The arrangement of the switching circuit 403 and the switching control between the resonant state and the non-resonant state remain unchanged from the first embodiment.

The controller 431 allows the switching circuit 403 to be switched between the state of FIG. 14A and the state of FIG. 14B during the current rising interval. During the current rising interval, therefore, the resonant state and the non-resonant state alternate.

FIG. 15 shows a curve representing the rise of a sinusoidal current when only the resonant state is utilized and a curve representing the rise of a current when the resonant state and the non-resonant state alternate. In this figure, PA stands for the duration of the resonant state and PB stands for the duration of the non-resonant state.

In the resonant state, the capacitor 412 and the gradient coil 3 are connected in series. Electric charge stored on the capacitor is applied to the gradient coil as a high voltage. A current flows in the forward direction (or the reverse direction) and its magnitude gradually increases.

In the non-resonant state, on the other hand, the gradient coil 3 is directly connected to the amplifier 401. In this state, electric charge stored on the capacitor is stored in the gradient coil as inductive energy. A current flows in the forward direction (or the reverse direction) and its magnitude is maintained at Ip.

Thus, the rise time of current when the resonant state and the non-resonant state alternate during the current rising interval becomes longer than that when the resonant state is kept during the current rising interval.

Next, the regulation of the current rise time will be described.

The controller 431 repeats a cycle consisting of the intervals PA and PB. A change of the current rise time is made by changing a ratio related to the length ΔTA of the interval PA and the length ΔTB of the interval PB in the cycle. Suppose here that the ratio is given by

ΔTA/(ΔTA+ΔTB)

Namely, the ratio is defined as the ratio of the duration of the resonant state to the period of the cycle. That is, the closer the ratio is to 1.0, the shorter the current rise time becomes and vice versa.

From the viewpoint of control, the most straightforward way to regulate the current rise time is to make the length ΔTA of the interval TA fixed and the length ΔTB of the interval TB variable. The longer the length ΔTB, the longer current rise time becomes and vice versa. With ΔTB=0, the current rises with resonance only and its rise time becomes shortest.

It is more preferable that the length ΔTB of the interval TB in one cycle be set to an integral multiple of a unit time ΔTunit (=n×ΔTunit). The shorter the unit time is set, the more finely the current rise time can be variable. Both the length ΔTA of the interval TA and the unit time ΔTunit are preferably set to the shortest switching time Δt from the point of view of the performance of the switches 408 to 411. In this case, "n" is treated as a parameter for determining the current rise time.

The controller 431 has a built-in ROM 433, in which a correspondence is established between rise times and parameter values. Upon receipt of a control signal representing a required rise time from the sequence controller 11, the controller 431 reads the value of the parameter n corresponding to that rise time from the ROM 433.

The controller 431 continuously supplies a first control signal to the switching circuit 403 for the time ΔTA and then continuously supplies a second control signal to the switching circuit for the time (n×ΔTunit) in accordance with the parameter value read from the ROM 433. The controller 431 repeats this cycle.

The first control signal refers to a combination of ON/OFF signals to the switches 408 to 411 for producing resonance and consists, as shown in FIG. 14A, of ON signals to the switches 409 and 410 and OFF signals to the switches 408 and 411. The second control signal refers to a combination of ON/OFF signals to the switches 408 to 411 for producing non-resonance and consists, as shown in FIG. 14B, of an ON signal to the switch 410 and OFF signals to the switches 408, 409, and 411.

In one cycle, the resonant state is continued for ΔTA and then the non-resonant state is continued for n×ΔTunit. Further, this cycle is repeated. Thus, the current rise time is set to the desired one.

FIGS. 16A, 16B and 16C show current rising waveforms when n=1, n=2, and n=3, respectively. FIG. 17 shows current rising characteristics corresponding to n=1, n=2, and n=3, respectively. When n=1, the current rises to the target value in about 180 microseconds. When n=2, the current rises to the same target value in about 380 microseconds. When n=3, the current rises to the same target value in about 600 microseconds.

Next, a description will be made of a specific way to calculate the duration PB of the non-resonant state for achieving a desired rise time of current. Let the shortest rise time when current is made to rise in the non-resonant state only be represented by t. Let the maximum current of the amplifier 401 be represented by Ip and the target current value be represented by Ix. Further, T is supposed to represent one-fourth of the period of the resonant frequency.

Then, Ix is given by $$Ix = Ip \times \sin((\pi/2T) \times t) \quad (1)$$

The resonant frequency f is calculated from the inductance L of the gradient coil 3 and the capacitance C of the capacitor 412 as $$f = 1/(2 \times \pi \times (L \times C)^{1/2}) \quad (2)$$

Since T corresponds to one-fourth of the period of the resonant frequency, equation (2) becomes $$1/(2 \times \pi \times (L \times C)^{1/2}) = 1/(4 \times T) \quad (3)$$

Equation (3) is rewritten into $$T = (\pi \times (L \times C)^{1/2})/2 \quad (4)$$

From equation (1) the shortest rise time t is given by $$t = ((2 \times T)/\pi) \times \sin^{-1}(Ix/Ip) \quad (5)$$

Suppose here that current is completely steady during the the non-resonant interval PB. Let the minimum switching time of the switches 408 to 411 be Δt. Suppose that the length ΔTA of the interval PA and the unit time ΔTunit of the interval PB are set to the minimum switching time Δt. Let the number of cycles required to reach the target current value Ix be N.

Then, the current rise time tr is given by $$tr = (\Delta TA + (n \times \Delta Tunit)) \times N = N \times \Delta t + n \times N \times \Delta t \quad (6)$$

The shortest rise time t is given by $$t = N \times \Delta t \quad (7)$$

From equation (7) we obtain $$N = t/\Delta t \quad (8)$$

From equations (8) and (5) we obtain $$N = ((2 \times T)/(\pi \times \Delta t)) \times \sin^{-1}(Ix/Ip) \quad (9)$$

Since the current rise time is prolonged according to n, we obtain $$n \times N \times \Delta t = (tr - t) \quad (10)$$

Thus, in order to attain the desired rise time tr, it is only required that the duration ΔTB of the non-resonant state interval PB be calculated by $$\Delta TB = \{\Delta t \times (\pi - 2 \times \sin^{-1}(Ix/Ip))\}/\{2 \times \sin^{-1}(Ix/Ip)\} \quad (11)$$

By setting the duration ΔTB of the non-resonant interval PB according to equation (11), the desired current rise time tr can be obtained. n is obtained from ΔTB obtained from equation (11) and the unit time Δt as $$n = \Delta TB/\Delta t = \pi/(2 \times \sin^{-1}(Ix/Ip)) - 1 \quad (12)$$

Of course, the adjustment of n permits the constant rise time control as shown in FIG. 18.

In addition, a current waveform can be shaped into a desired one by changing the ratio ΔTA/(ΔTA+ΔTB) by the controller 431.

It is possible to make an actual current waveform similar to a target waveform represented by a waveform signal from the waveshaper 402 more precisely. The controller 431 receives a waveform signal from the waveshaper 402. The controller makes a comparison between an actual current value detected through the inductance 432 and a target current value represented by the waveform signal at regular intervals. When the difference between the actual current value and the target current value is not within a prescribed tolerance, the controller 431 increments or decrements the parameter n to thereby extend or shorten the duration ΔTB of the non-resonant state. When that difference is greater than the upper limit of the tolerance, n is incremented to n+1 to extend the duration ΔTB of the non-resonant state. On the other hand, when the difference is lower than the lower limit of the tolerance, n is decremented to n−1, thereby shortening the duration ΔTB. Such feedback control permits the actual current waveform to become very close to the target waveform the waveform signal represents.

Note that high-frequency components produced by switching between the resonant state and the non-resonant state as in the present embodiment can be reduced by a lowpass filter.

According to the present embodiment, as described above, even a resonant type of gradient magnetic field power supply permits the current rise time to be variable.

A third embodiment of the invention relates to an improvement of a gradient magnetic field power supply which uses an auxiliary power supply to make current rise rapidly.

Figure 19:
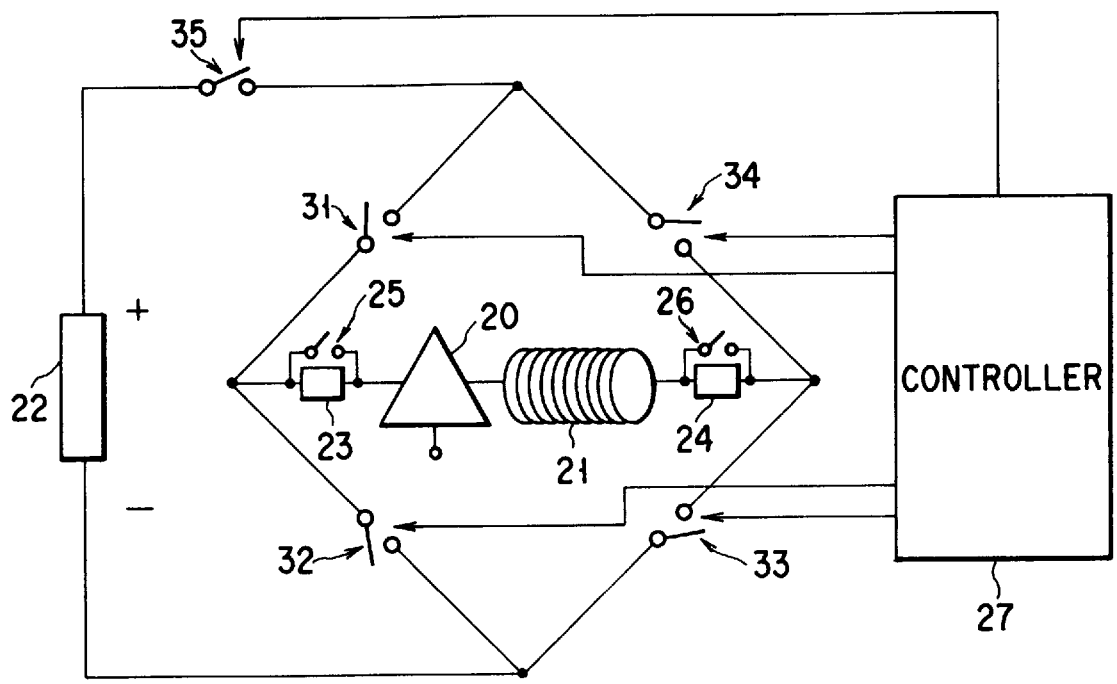
FIG. 19 shows an arrangement of a gradient magnetic field power supply according to a third embodiment of the invention.

FIG. 19 shows an arrangement of a gradient magnetic field power supply according to the third embodiment, which includes a main power supply 20 and an auxiliary power supply 22 providing high voltage. Four switches 31 to 34 are connected in a bridge configuration. The main power supply 20 and a gradient coil 21 are connected in series between two points on the two parallel branches of the bridge. The auxiliary power supply 22 is connected across the two parallel branches of the bridge via a switch 35. A controller 27 turns the switches 31 to 35 ON and OFF. When the switch 35 is turned ON, the main power supply 20 and the auxiliary power supply 22 supply current to the gradient coil 21 jointly. When the switch 35 is turned OFF, the main power supply 20 supplies current to the gradient coil by itself.

On either side of the gradient coil 21 there are provided lowpass filters 23 and 24, which eliminates switching noise that occurs when the switches 31 to 34 are operated at high speed. Switches 25 and 26 are connected across the lowpass filters 23 and 26, respectively, and, when turned ON, provide bypasses to remove the filters from the power supply loop for the gradient coil. When turned OFF, the switches 25 and 26 permit the lowpass filters 23 and 24 to be inserted in the power supply loop for the gradient coil.

Figure 20:
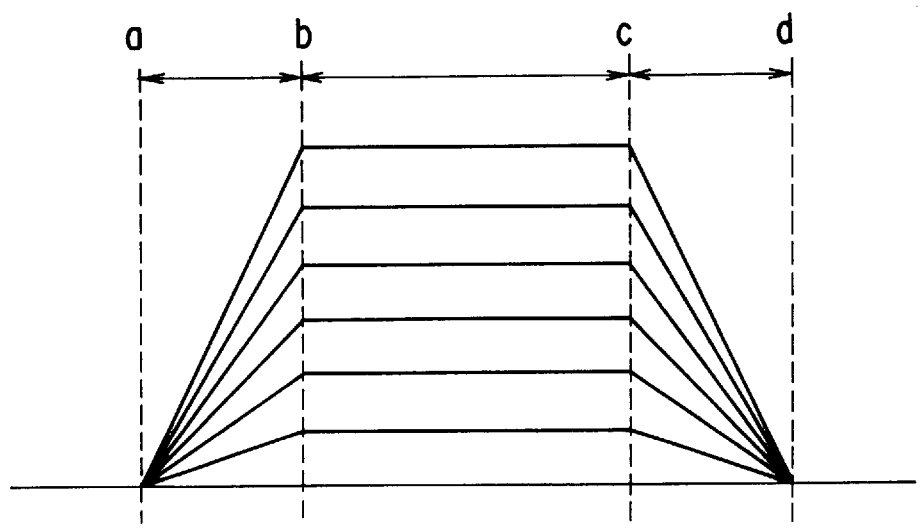
FIG. 20 shows current waveforms with linear rise.

FIG. 20 shows current waveforms when the auxiliary power supply 22 is used to cause current to rise linearly. FIG. 21 shows the state of the power supply when the auxiliary power supply 22 is used to cause current to rise in the forward-current direction. To cause current to rise linearly, the switch 35 is turned ON continuously to use the auxiliary power supply 22. To cause current to rise in the forward-current direction, the switches 31 and 33 on the opposed arms of the bridge are turned ON and the switches 32 and 34 on the other opposed arms are turned OFF. To make current rise in the reverse-current direction, the switches 32 and 34 are turned ON and the switches 31 and 33 are turned OFF. When current reaches a target magnitude, the switch 35 is turned OFF, SW31 is turned ON, SW32 is turned OFF, SW33 is turned OFF and SW34 is turned ON (SW31 is turned OFF, SW32 is turned ON, SW33 is turned ON and SW34 is turned OFF), thereby switching into independent drive by the main power supply 20. In this case, high-speed switching is unnecessary. Accordingly, the switches 25 and 26 are turned ON, so that the lowpass filters 23 and 24 are bypassed and the directed connection between the main power supply 20 and the gradient coil 21 is obtained.

Figure 23:
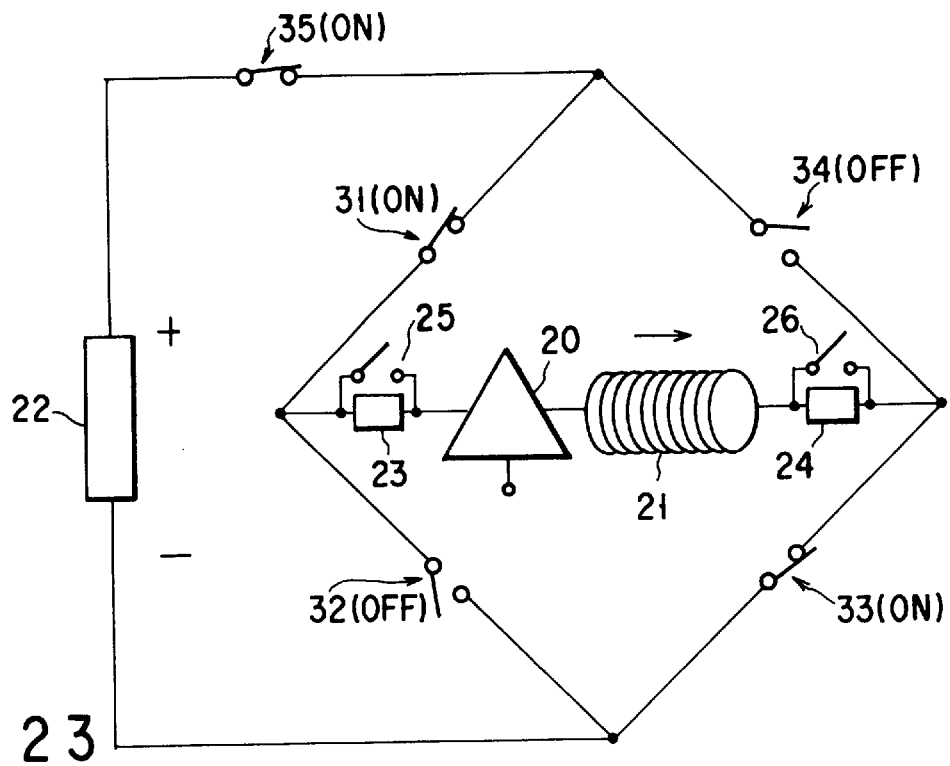
FIG. 23 shows a first state of the gradient magnetic field power supply.
Figure 24:
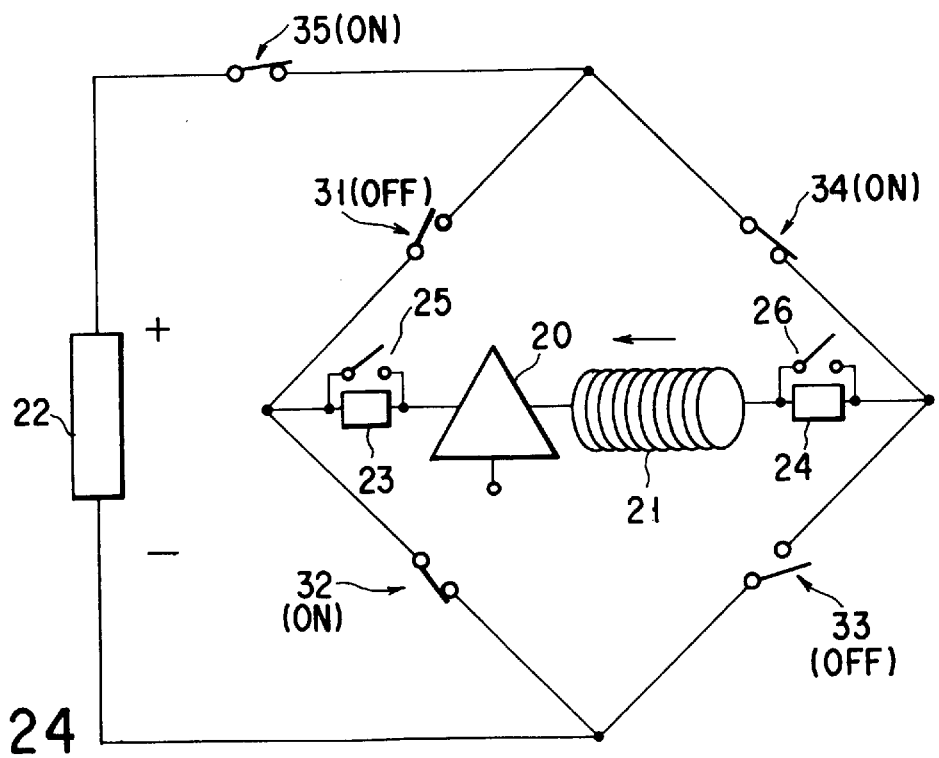
FIG. 24 shows a second state of the gradient magnetic field power supply.

FIG. 22A shows current waveforms formed sinusoidal wave. FIG. 23 shows current waveforms formed sinusoidal wave that an amplitude increases with the time. FIG. 23 shows the state (first state) of the power supply when current is supplied from the auxiliary power supply 22 to the gradient coil 21 in the positive direction. FIG. 24 shows the state (second state) of the power supply when current is supplied from the auxiliary power supply 22 to the gradient coil 21 in the negative direction. The first state shown in FIG. 23 is obtained by turning the switches 31, 33 and 35 ON and the switches 32 and 34 OFF. The second state shown in FIG. 24 is obtained by turning the switches 32, 34 and 35 ON and the switches 31 and 33 OFF.

In order to change a current like a sinusoidal waveform, it is required to alternate the current at high speed and shape its waveform. In order to change the current at high speed, it is required to invert the polarity of the current supplied by the auxiliary power supply 22 to the gradient coil 21 at high speed by switching between the first and second states at high speed. To shape the current waveform to fit a sinusoidal waveform, it is necessary to perform pulse width modulation (PWM). More precisely, the switches 31, 32, 33 and 34 need to be alternately turned on and off, so that the switches 31, and 33 are on and the switches 32 and 34 are off during a period ΔT1, and vise versa during the next period ΔT2. For example, $1/(\Delta T1+\Delta T2)$ is fixed at ten times the output frequency or a greater value, and $\Delta T1/\Delta T2$ is changed.

In order to change a current like a sinusoidal waveform in this manner, high-speed switching of the switches 31 to 34 is necessary. Such high-speed switching will produce switching noise.

During the interval when the switches 31 to 34 are switched at high speed to obtain a current approximating a sinusoidal wave, the switches 25 and 26 are turned OFF continuously as shown in FIGS. 23 and 24. Thereby, the lowpass filters 23 and 24 are operatively coupled to the gradient coil 21. As a result, switching noise is eliminated. Further, high-frequency components resulting from the intermittent turning of the switch 35 ON and OFF can be reduced by the lowpass filters 23 and 24.

Although the preferred embodiments of the invention have been described and disclosed, it is apparent that other embodiments and modifications are possible.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A gradient magnetic field power supply for gradient coil comprising:

amplifier means for supplying a current to said gradient coil;

feedback circuit means for feeding a portion of an output current of said amplifier means back to an input of said amplifier;

phase compensating means for compensating the phase of a feedback current from said feedback circuit means to said amplifier means, said phase compensating means having its frequency response made variable; and changing means for changing the frequency response of said phase compensating means according to a change in a load impedance of said amplifier means.

2. The power supply according to claim 1, wherein said phase compensating means has a first phase compensating circuit with a first frequency response and a second phase compensating circuit with a second frequency response, and said changing means has switching means for making a selection between said first and second phase compensating circuits.

3. The power supply according to claim 2, wherein said first and second phase compensating circuits are connected in parallel with said amplifier means, and said changing means includes a first switch connected in series with said first phase compensating circuit, a second switch connected in series with said second phase compensating circuit, and means for selectively turning ON one of said first and second switches.

4. The power supply according to claim 1, further comprising a capacitor, and means for selecting one of first and second states, said first state being such that said capacitor is inserted between said gradient coil and said amplifier means and said gradient coil and said capacitor forms a series resonant circuit and said second state being such that said capacitor is removed from between said gradient coil and said amplifier means and said gradient coil and said amplifier are directly connected to each other.

5. The power supply according to claim 4, wherein said phase compensating means has a first phase compensating circuit with a first frequency response and a second phase compensating circuit with a second frequency response, said first frequency response being determined according to a load impedance of said amplifier means in said first state and said second frequency response being determined according to a load impedance of said amplifier means in said second state.

* * * * *